(12) United States Patent
Ota et al.

(10) Patent No.: US 6,693,303 B2
(45) Date of Patent: Feb. 17, 2004

(54) NITRIDE SEMICONDUCTOR DEVICE AND METHOD FOR MANUFACTURING THE SAME

(75) Inventors: Hiroyuki Ota, Tsurugashima (JP); Masayuki Sonobe, Kyoto (JP); Norikazu Ito, Kyoto (JP); Tetsuo Fujii, Kyoto (JP)

(73) Assignees: Pioneer Corporation, Tokyo (JP); Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/166,048

(22) Filed: Jun. 11, 2002

(65) Prior Publication Data
US 2003/0001161 A1 Jan. 2, 2003

(30) Foreign Application Priority Data
Jun. 12, 2001 (JP) ......................................... 2001-177383

(51) Int. Cl.$^7$ .............................................. H01L 27/13
(52) U.S. Cl. .......................................... 257/79; 257/83
(58) Field of Search ............................... 257/79, 80, 83, 257/94, 96, 13, 21, 97, 103, 22; 372/46; 438/46, 81

(56) References Cited

U.S. PATENT DOCUMENTS

| | | | | |
|---|---|---|---|---|
| 5,034,955 A | * | 7/1991 | Kashima et al. | .......... 372/46 X |
| 6,284,559 B1 | * | 9/2001 | Hata | .......................... 438/46 |
| 6,337,493 B1 | * | 1/2002 | Tanizawa et al. | ............. 257/79 |
| 6,404,792 B1 | * | 6/2002 | Yamamoto et al. | ........... 372/46 |

* cited by examiner

Primary Examiner—Long Pham
Assistant Examiner—(Vikki) Hoa B. Trinh

(57) ABSTRACT

A nitride semiconductor device is composed of Group III nitride semiconductors. The device includes an active layer, and a barrier layer made from a predetermined material and provided adjacent to the active layer. The barrier layer has a greater band-gap than that of the active layer. The device also includes a barrier portion formed of the predetermined material for surrounding a threading dislocation in the active layer. The barrier portion has a vertex. The device also includes a semiconductor layer having an impurity concentration ranging from 1E16/cc to 1E17/cc in which the vertex is placed.

7 Claims, 3 Drawing Sheets

NITRIDE SEMICONDUCTOR DEVICE AND METHOD FOR MANUFACTURING THE SAME

BACKGROUND OF THE INVENTION

1. Field of the Invention

The present invention relates to a Group III nitride semiconductor device (also referred to as device hereinbelow) and a method for manufacturing the same.

2. Description of the Related Art

Extensive research is now underway on semiconductor light-emitting devices, in particular, a short-wave length semiconductor laser device based on gallium nitride (GaN) and related compounds as a material system for the device. A GaN-based semiconductor laser device is manufactured by successively depositing semiconductor single-crystal layers such as $(Al_xGa_{1-x})_{1-y}In_yN$ ($0 \leq x \leq 1$, $0 \leq y \leq 1$) on a crystal substrate.

A metal organic chemical vapor deposition method (abbreviated as MOCVD hereinbelow) is generally used to produce such a single-crystal layer. In this method, source gases containing trimethyl gallium (abbreviated as TMG hereinbelow) as a Group III precursor material and ammonia ($NH_3$) as a Group V precursor material are introduced into a reactor to react at a temperature within the range of 900–1000° C., thereby depositing compound crystals on the substrate. Various compounds can be layered on the substrate by changing the ratio of the precursors fed into the reactor to obtain a multi-layer structure.

If the deposited single-crystal layer has many penetrating defects, the light emitting performance of the device is deteriorated substantially. Such defect is called threading dislocation, which is a linearly extending defect that penetrates the crystal layer along the growth direction. Since a threading dislocation acts as a non-radiative recombination center for carriers, a semiconductor light-emitting device comprising a layer with many dislocations suffers from poor luminous efficiency. The mentioned above defect is generated due to crystal misfit strain at an interface between the substrate and an overlying layer formed thereon. Attempts to reduce the effect of the misfit at the interface have been made by choosing substrate materials having similar crystal structure, lattice constant, and thermal expansion coefficient to those of GaN-based crystal.

There is no substrate low-priced and lattice-matched to a nitride semiconductor. Sapphire plates are therefore mainly utilized as substrates for the epitaxial growth of nitride semiconductor. In this case, the threading dislocations are generated due to the lattice mismatch since sapphire has a lattice constant different from that of GaN by about 14%. It is unavoidable that the density of threading dislocations becomes $1E8/cm^2$ or more even under the best conditions. Epitaxially Lateral Over-growth (ELO) or the like can drastically reduce the dislocation density. However ELO drastically raises the manufacturing cost of devices. The adaptation of ELO to the manufacture of the nitride semiconductor device such as a light emitting diode or the like has no practical use.

Unexamined Japanese patent KOKAI Publication No. 2000-232238 (U.S. Pat. No. 6,329,667) discloses a conventional technology improving some properties of the nitride semiconductor laser device. In the disclosed prior art, formation of pits or recesses about the threading dislocations is preformed during epitaxial growth on a wafer after the growth of the active layer is finished. Then the pits of the active layer are buried with a material having a wider band-gap than that of the active layer and, after that, the other structural layers of device are layered. This technology improves the luminescence characteristics of the device because injection of carriers to the threading dislocations is avoided.

In the case of a pn junction diode formed by growing nitride semiconductors onto a dissimilar substrate such as a sapphire substrate or the like, the leakage current under reverse bias tends to be high in comparison with that of the semiconductor device of GaAs or the like. This diode characteristic originates in the high density of threading dislocations in the grown layers mentioned above.

The inventors have revealed that, although the prior art mentioned above does permit the decrease of luminescence efficiency caused by the threading dislocations under forward injection to improve the luminescence characteristics of the device, it still fails to solve the reverse leakage current problem. The increase of the reverse leakage current incurs substandard products resulting in hindering the increase of production yield. For example, the technical specification for a light emitting diode usually involves an item of leakage current under an application of reverse voltage thereto, e.g., less than 10 $\mu A$ at 5 V applied.

OBJECT AND SUMMARY OF THE INVENTION

The present invention has been made in view of the deterioration of current-voltage characteristic, i.e., the large reverse leakage of the nitride semiconductor device described above, and an object thereof is to provide a nitride semiconductor device having good current-voltage characteristics while allowing the generation of defects passing through the single-crystal layers grown on a substrate.

According to one aspect of the present invention, there is provided a nitride semiconductor device including Group III nitride semiconductors comprising:

an active layer;

a barrier layer made from a predetermined material and provided adjacent to said active layer, said barrier layer having a greater band-gap than that of said active layer;

a barrier portion formed of said predetermined material for surrounding a threading dislocation in said active layer, said barrier portion having a vertex; and a semiconductor layer having an impurity concentration ranging from 1E16/cc to 1E17/cc in which said vertex is placed.

In the nitride semiconductor device mentioned above, said active layer has one of a single and multiple quantum well structure.

In the nitride semiconductor device mentioned above, said predetermined material of said barrier layer fills up a recess enclosed with an interface on said active layer to smooth surfaces of said recess as the barrier portion.

In the nitride semiconductor device mentioned above, said barrier portion has one of a cone-shape, truncated cone shape and a combination thereof.

In the nitride semiconductor device mentioned above, said Group III nitride semiconductors are $(Al_xGa_{1-x})_{1-y}In_yN$ ($0 \leq x \leq 1$, $0 \leq y \leq 1$).

The nitride semiconductor device mentioned above may further comprise a low temperature barrier layer provided between said barrier layer and said active layer, said low temperature barrier layer being formed of substantially the same predetermined material as that of said barrier layer at substantially the same temperature as the growth temperature of said active layer.

In the nitride semiconductor device mentioned above, said low temperature barrier layer has a lower AlN composition ratio than that of said barrier layer.

According to another aspect of the present invention, there is provided a method for manufacturing a nitride semiconductor device including Group III nitride semiconductors and having an active layer and a barrier layer made from a predetermined material with a greater band-gap than that of the active layer and disposed adjacent to said active layer, the method comprising the steps of:

forming a semiconductor layer having an impurity concentration ranging from 1E16/cc to 1E17/cc;

forming the active layer over the semiconductor layer having a recess attributable to a threading dislocation in the active layer; and depositing the material of the barrier layer onto the active layer to form a barrier portion surrounding the threading dislocation and having an interface defined by the side surface of the recess.

In the method for manufacturing a nitride semiconductor device mentioned above, the step of forming the active layer includes a step of etching the active layer after the active layer is deposited.

In the method for manufacturing a nitride semiconductor device mentioned above, the etching in the step of etching is terminated when erosion along the threading dislocation reaches the underlying semiconductor layer.

In the method for manufacturing a nitride semiconductor device mentioned above, the step of forming the semiconductor layer at a temperature within a range of 600–850° C. prior to the growth of the active layer.

In the method for manufacturing a nitride semiconductor device mentioned above, the method further comprises the step of forming a low temperature barrier layer of substantially the same material as that of the barrier layer at substantially the same temperature as a growth temperature of the active layer between the step of forming the pit and the step of depositing the material.

In the method for manufacturing a nitride semiconductor device mentioned above, the low temperature barrier layer has a lower AlN composition ratio than that of the barrier layer.

BRIEF DESCRIPTION OF THE DRAWINGS

The aforementioned aspects and other features of the invention are explained in the following description, taken in connection with the accompanying drawing figures wherein.

DETAILED DESCRIPTION OF THE PREFERRED EMBODIMENTS

A light emitting diode device made of Group III nitride having a pn junction according to an embodiment of the present invention will be described below with reference to the drawings.

Figure 1:
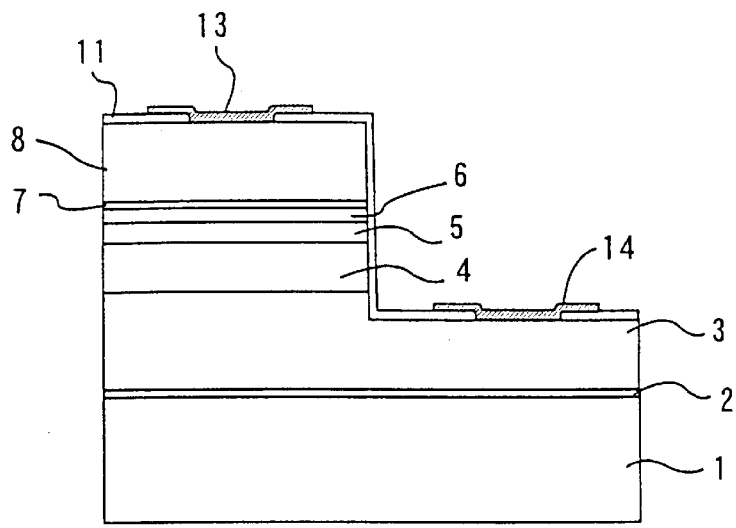
FIG. 1 is a schematic, cross sectional view showing a light emitting diode of an embodiment according to the present invention.

FIG. 1 shows the light emitting diode device according to the embodiment. The semiconductor device comprises a GaN (or AlN) layer 2 formed at a lower temperature, an n-type GaN layer 3, an n-type $Al_{0.1}Ga_{0.9}N$ layer 4, an n-type GaN layer 5, an active layer 6 including InGaN as a main constituent, a p-type $Al_{0.2}Ga_{0.8}N$ layer 7, and a p-type GaN layer 8, which are deposited in the above order on a single crystal sapphire substrate 1. The device further comprises a p-type electrode 13 connected to the p-type GaN layer 8 and an n-type electrode 14 connected to the n-type GaN layer 3. The device is covered with an insulating layer 11 made of $SiO_2$ except the electrodes. The semiconductor device emits light through recombination of electrons and holes in the active layer 6. The p-type $Al_{0.2}Ga_{0.8}N$ layer 7 is a barrier layer for enhancing the confinement of injected carriers (in particular, electrons). The p-type GaN layer 8 is a contact layer. The n-type GaN layer 5 is a pit-generating layer. The n-type $Al_{0.1}Ga_{0.9}N$ layer 4 is a first low-impurity-concentration layer. The pit-generating layer 5 is a second low-impurity-concentration layer. The n-type GaN layer 3 is an underlying base layer which allows a current to flow. The n-type GaN layer 3 is required because sapphire constituting the substrate does not have any electrical conductivity. Additionally, the lower-temperature growth layer, or GaN (or AlN) layer 2 is a so-called buffer layer for producing a smooth layer on the sapphire substrate which is a substance dissimilar to GaN.

Figure 2:
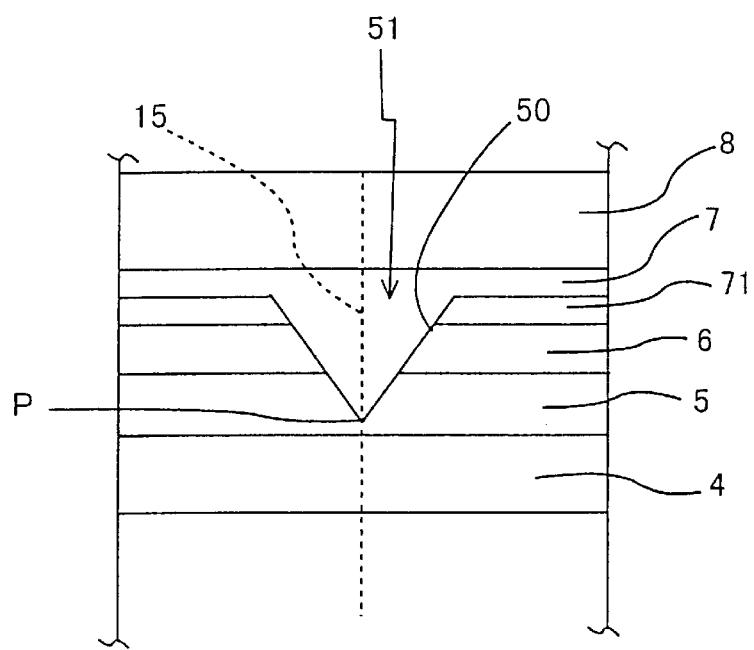
FIG. 2 is a partially enlarged cross sectional view showing an active layer of the light emitting diode of the embodiment according to the present invention.

Referring to FIG. 2, the light emitting diode device further comprises a barrier portion 51 defined by an interface 50 on the active layer 6 and formed of the same material as that of the barrier layer 7. The interface 50 surrounds and spreads around a threading dislocation 15 extending from the pit-generating layer 5 to the contact layer 8 through the active layer 6. At least one of neighboring two semiconductor layers 4 and 5 (the first and second low-impurity-concentration layers) in the barrier portion 51 has an impurity concentration ranging from 1E16/cc to 1E17/cc lower than the other layers. Namely, each pit i.e., the barrier portion 51, formed through the active layer 6 has a reverse coned shape recess whose vertex P is placed in the pit-generating layer 5 having the low impurity concentration. The $(Al_xGa_{1-x})_{1-y}In_yN$ ($0 \leq x \leq 1$, $0 \leq y \leq 1$) layer doped with an n-type impurity and having a high electrical conductivity is provided underneath the pit-generating layer 5, i.e., low-impurity-concentration layer.

When a forward current flows into the device, electrons are injected from the n-type GaN pit-generating layer 5 into the active layer 6 made of InGaN having a high Indium (In) composition ratio (that is, narrower band-gap), as shown in FIG. 2. Further, holes injected from the p-type GaN contact layer 8 are also collected by the active layer 6 for the same reason. In this case, being blocked by the AlGaN barrier portion 51, both of electrons and holes cannot reach the threading dislocation 15. This is because the threading dislocation 15 is surrounded by the AlGaN barrier portion 51 having a larger band-gap as compared with that of the active layer 6, which comprises InGaN with a high In composition ratio. Thus, the barrier portion 51 prevents the injected carriers from reaching the threading dislocation 15, which usually acts as a non-radiative recombination center. The device has a luminescence efficiency higher than that of one having no barrier portion 51.

According to the invention, the low-impurity-concentration layer i.e., pit-generating layer 5 existing adjacent to vertex P of the barrier portion 51 surrounding the threading dislocations 15 suppresses the leakage current that would otherwise flow upon application of the reverse voltage to the device.

Generally, the luminous efficiency of nitride semiconductor light emitting diode is effectively enhanced by increasing the carrier concentration of the active layer in unbiased state through n-type doping to the active layer or the adjacent layers thereto. However, if the doping concentration of the n-type impurity is too high, a depletion layer becomes thin and the electric field strength increases. As a result, the high density of threading dislocations leads to the increase of leakage current.

In contrast, the nitride semiconductor device according to the invention has a structure in which the barrier portion 51 excludes the n-type material from the vicinity of each threading dislocation that conveys the leakage current upon application of reverse voltage to the device, as shown in FIG. 2. The invention therefore enables high level n-type doping to the active layer while controlling the thickness of the depletion region around the threading dislocations with the parameters of the low-impurity-concentration layer.

Figure 5:
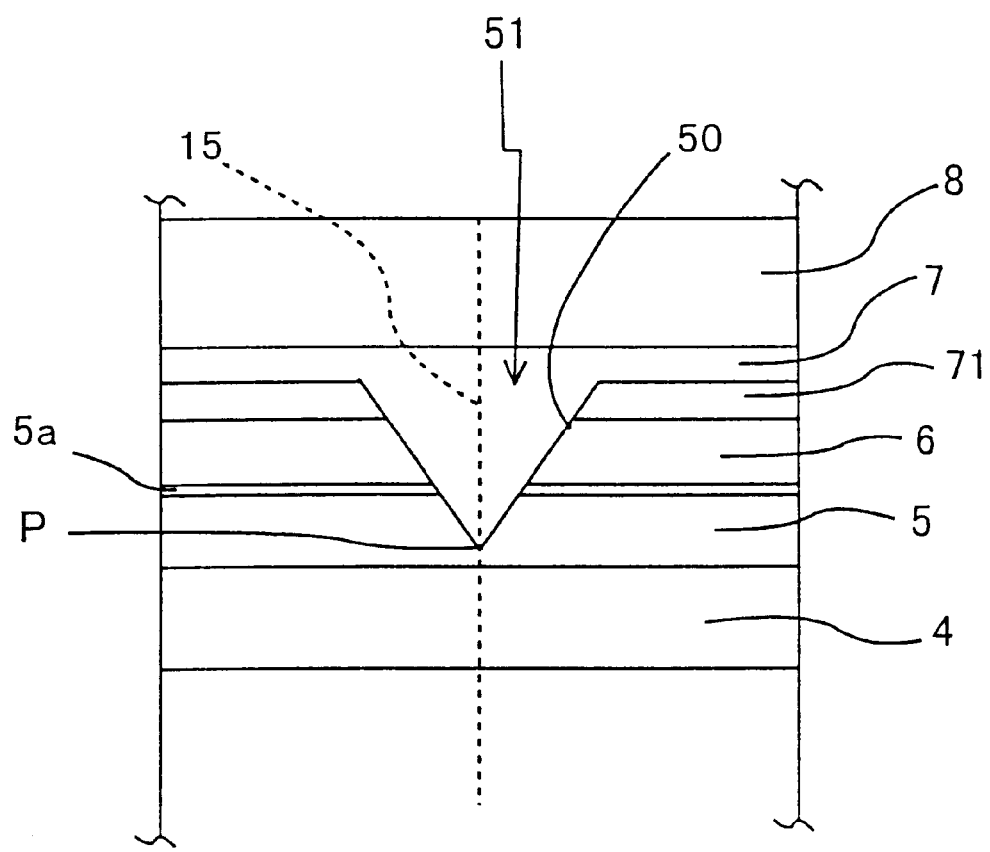
FIG. 5 is a partially enlarged cross sectional view showing an active layer in a light emitting diode of another embodiment according to the present invention.

Moreover, the nitride semiconductor device according to the invention may further comprise an n-type doped layer 5a having a high doping concentration of the n-type impurity between the active layer 6 and the pit-generating layer 5, as shown in FIG. 5, because the barrier portion 51 excludes the n-type material from the vicinity of each threading dislocation that conveys the leakage current upon application of the reverse voltage to the device.

An LED having the structure shown in FIG. 1 will be manufactured in the following process in which a layer-structure of the device is formed on a sapphire A-face substrate by MOCVD. This embodiment adopts a method of forming the pits in-situ around threading dislocations in the active layer. That is, the embodiment utilizes the fact that crystal growth can be inhibited near each threading dislocation under particular growth conditions.

First, a sapphire substrate 1 is loaded into a MOCVD reactor, and then placed in a hydrogen gas flow under a pressure of 300 Torr at a temperature of 1050° C. for ten minutes for thermal cleaning of the surface of the substrate. The sapphire substrate 1 is then cooled to a temperature of 400° C. Next, using a carrier gas of hydrogen, an ammonia $NH_3$ and trimethyl aluminum (TMA) as precursor materials are introduced to the reactor to grow AlN layer, thereby forming a buffer layer 2 having a thickness of 50 nm.

Next, after stopping the feed of TMA, the sapphire substrate 1 with the buffer layer 2 is again heated up to 1050° C. while only $NH_3$ gas is flowing through the reactor. Trimethyl gallium (TMG) is then introduced into the reactor to grow an n-type GaN underlying layer 3. During the above process, methylsilane (Me-$SiH_3$) as an n-type dopant is added to the precursor material gas so that the n-type GaN underlying layer 3 has a Silicon (Si) concentration of 2E18/cc.

At a point in time when the n-type GaN underlying layer 3 has been grown to a thickness of about 4 $\mu$m, the feed rate of methylsilane is reduced to ⅟₂₀, so that an n-type AlGaN layer 4 is grown to a thickness of 0.1 $\mu$m as a first low-impurity-concentration layer, the supply of the precursor gases is stopped except $NH_3$ and the wafer is cooled to a temperature in the range of 600 to 850° C. When the wafer is cooled at 770° C. for example, the carrier gas is switched from hydrogen to nitrogen. When the nitrogen gas flow has been stabilized, TMG and methylsilane are introduced into the reactor so as to grow an n-type InGaN layer 5 doped with Si to a thickness of 400 Å as a second low-impurity-concentration layer. The n-type InGaN layer 5 of the second low-impurity-concentration layer services as a pit-generating layer. During this process, portions where the growth is inhibited are initiated in situ. In addition, material of the pit-generating layer 5 is not limited to InGaN but may be a material such a GaN, AlGaN, or the like having a band-gap equal to or greater than that of the active layer. Also, non-doped material may be used for the n-type InGaN layer 5. The generation of the pits is promoted by lowering the growth temperature of the n-type InGaN layer 5 and, the growth temperature of higher than 850° C. is insufficient for promoting the pit-generation. Pits in the n-type InGaN layer are infallibly generated at 600° C. or lower; however, such growth temperature is not preferable because of the degradation of layer quality. Further, to establish the growth inhibition of the portion around the threading dislocations, the pit-generating layer 5 is required to have a thickness of 100 Å or more, and preferably to about 200 Å. Recesses are to develop from the pits, since the crystal growth on the threading dislocations in the following step is also suppressed.

Subsequently, at the completion of the pit-generating layer 5, the supply of the TMG and Me-$SiH_3$ is stopped and the cooling of the substrate is started. When the substrate temperature has reached 750° C., TMG, trimethylindium (TMI) and Me-$SiH_3$ are introduced into the reactor so that the active layer 6 having a high In composition ratio is grown.

A growth temperature of 1000° C. or higher is required in the step for forming the barrier portion 51 to enhance the surface planarization of AlGaN. Such a growth temperature causes re-evaporation of the constituent from the InGaN active layer 6 during the ramp to the growth temperature resulting in the deterioration of the active layer 6. To avoid this, a low temperature AlGaN barrier layer 71 starts to be grown at the time when the formation of the InGaN active layer 6 is completed. The low temperature AlGaN barrier layer 71 is a film constituting a part of the AlGaN barrier layer 7. The low temperature AlGaN barrier layer 71 is disposed utilizing the fact that AlN has much higher thermal stability as compared with GaN in the growth ambience. The re-evaporation described above can be effectively prevented by depositing a minute layer of low temperature AlGaN having an AlN composition ratio of about 0.2. The low temperature AlGaN barrier layer 71 preferably has a thickness corresponding to several molecules, that is, about 20 Å. Excessive thickness of this layer will deteriorate hole injection into the active layer from the p-type layer. Thus the thickness is preferably less than 100 Å. In this way, the low temperature AlGaN barrier layer 71 is grown immediately after forming the active layer 6 without changing the substrate temperature. The pits are hardly filled up because of the low growth temperature of AlGaN barrier layer 71.

Then, the substrate is again heated to 1050° C. while $NH_3$ and hydrogen as a carrier gas are flowing. TMG, TMA, and ethyl-cyclopentadienyl magnesium (Et—$Cp_2$ Mg) as a precursor for p-type dopant are introduced into the reactor to grow a p-type AlGaN layer 7 with a thickness of 0.02 $\mu$m on the low temperature grown AlGaN barrier layer 71.

The pits (recesses) are filled with the p-type AlGaN during the growth of the p-type AlGaN barrier layer 7, because both of the high temperature of 1050° C. and the nature of AlGaN (material) promote the surface flattening of the barrier layer 7. Once the smooth surface of the barrier layer is established, the individual layer to be formed above the barrier layer 7 can be formed with a flat surface. Thus, the barrier portion 51 is formed to have a conical or truncated-conical shape. The pit may have a unified shape which is contiguous to one another depending on the configuration of pits.

In the light emitting device according to the embodiment, the low temperature AlGaN barrier layer 71 has a lower composition ratio of AlN than that of the AlGaN barrier layer 7. If the low temperature AlGaN barrier layer 71 has a higher composition ratio of AlN than that of the AlGaN barrier layer 7, holes injected from the p-type GaN layer 8 will tend to be injected into the barrier portions 51 of the AlGaN barrier layer 7 which has a smaller composition ratio of AlN (or a smaller band-gap).

By setting the AlN composition ratio of the low temperature AlGaN barrier layer 71 to be less than that of the AlGaN barrier layer 7, the holes injected from the p-type layer are blocked by the barrier portions 51 in a similar way to the electrons injected from the n-type layer, thereby not reaching the threading dislocations 15.

In summary, after the growth of the active layer, a low temperature AlGaN barrier layer 71 is formed at substantially the same temperature as that of the growth temperature of the active layer. A second AlGaN barrier layer 7 is then formed after the temperature is raised. The AlGaN barrier layer 7 is set to have a higher composition ratio of AlN than that of the low temperature AlGaN barrier layer 71.

Subsequently, the feeding of TMA is stopped, and a p-type GaN layer 8 is grown on the barrier layer 7 to have a thickness of 0.1 $\mu$m. Thereafter, supply of TMG and Et—Cp$_2$ Mg is stopped, and cooling is started. At a point in time when the substrate is cooled to 400° C., supply of NH$_3$ is also stopped. At a point in time when the substrate is cooled to a room temperature, the substrate is unloaded from the reactor. The wafer is subjected to a heat treatment in a furnace to acquire p-type condition at a temperature of 800° C. for 20 minutes in nitrogen gas at atmospheric pressure.

Each of the resultant wafers is processed to have terraces for the p-type electrodes and current paths for the n-type electrodes. Such a structure is formed on the substrate by using standard photolithography and reactive ion-etching (RIE) to remove unnecessary portions from the wafer to expose the n-type GaN base layer 3 partially.

After removal of an etching mask, a SiO$_2$ protective layer is deposited by means of a sputtering method or the like. The P-side windows for p-type electrodes are formed in the SiO$_2$ protective film on the p-type layer. The n-side windows for n-type electrodes are formed in the SiO, protective film on the exposed portion of the n-type layer.

An n-type electrode 14 is formed on the region on which the n-type GaN layer 3 is exposed, by depositing Ti (titanium) to a thickness of 50 nm and subsequently Al (aluminum) to 200 nm. The p-type electrode 13 is formed in the region, where the p-type GaN layer is exposed, by evaporating Ni (nickel) and Au (gold) with thickness of 50 mm and 200 nm, respectively.

Each wafer processed in this manner is cleaved to form a device shown in FIG. 1. Thereafter, the voltage/current characteristics of the respective devices are measured.

Figure 3:
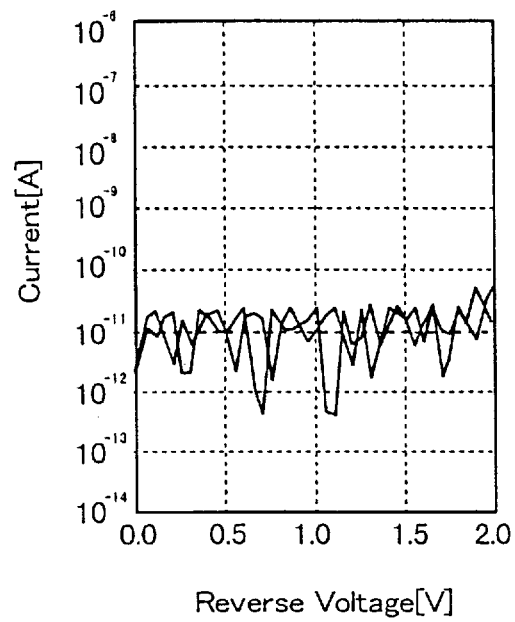
FIG. 3 is a graph showing curves of voltage/current characteristics of light emitting diodes according to an embodiment of the present invention.

FIG. 3 is a graph showing curves of leakage characteristics of the reverse voltage vs. current of LED devices fabricated according to the present invention.

Figure 4:
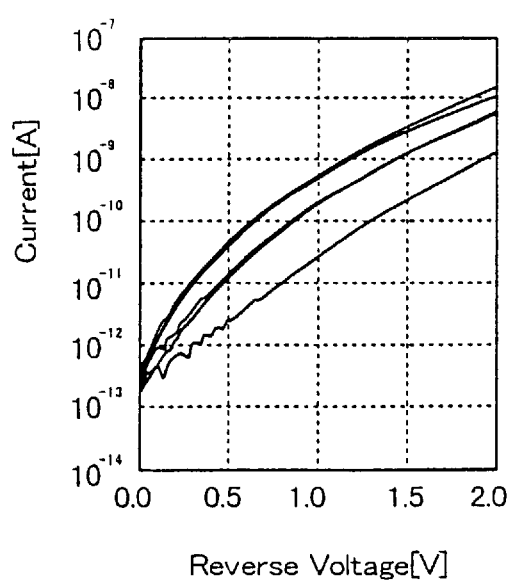
FIG. 4 is a graph showing curves of voltage/current characteristics of comparative light emitting diodes.

FIG. 4 is a graph showing curves of leakage characteristics of the reverse voltage vs. current of comparative LED devices fabricated for comparison to the invention. The comparative device has the same structure as the embodiment shown in FIG. 3 except that the first low-impurity-concentration layer 4 is not formed in the wafer film-formation step, the n-type GaN base layer 3 is 0.1 $\mu$m thicker than that of the embodiment, and the Si concentration in the pit-generating layer 5 (the second low-impurity-concentration layer) is the same as that of the n-type GaN base layer 3.

As apparent from FIGS. 3 and 4, the light emitting diode devices of the embodiment according to the present invention exhibit remarkable reduction of leakage current. In the present invention, the Si concentration in the pit-generating layer is set to 1E17/cc which is much lower than that of the comparative device. As a result, the thickness of depletion layer formed adjacent to the vertex of the reverse coned shape recess i.e., barrier portion 51 remarkably increases, particularly, the thickness of n-type layer side increases. In addition, since the first low-impurity-concentration layer 4 is disposed underneath the pit-generating layer in the present invention, the depletion layer is formed within the first low-impurity-concentration layer 4 even in the case that pits are generated at the lowest end of the pit-generating layer. Therefore, the electric field in the depletion layer in reverse voltage is effectively reduced, so that the leakage current is reduced. The impurity concentration in at least one of the first and second low-impurity-concentration layer is preferably set to 1E17/cc or less for obtaining an effective result of the invention. An exceedingly low setting of impurity concentration tends to raise the operation voltage under forward bias. Thus it is not preferable to set the impurity concentration in the first and second low-impurity-concentration layers to be less than 1E16/cc. The thickness of the first low-impurity-concentration layer 4 is preferably set to 0.05 $\mu$m or more for obtaining an effective result of the invention, but a setting in excess of 0.2 $\mu$m causes unfavorable in the operating voltage under forward bias.

The above embodiment utilizes that the reduction of the leakage current is obtained by increasing the thickness of the depletion layer in the n-type layer. According to the invention, the leakage current may be also reduced by decreasing the Mg concentration in the p-type side of the vertex of the reverse coned shape recess (barrier portion 51) i.e., the p-type AlGaN barrier layer. This approach, however, does not lead to preferable result similar to the above embodiment, rather sacrifice, the luminescence characteristics of the device under forward current injection (i.e., normal operation). The main function of the p-type AlGaN barrier layer is to prevent the overflow of electrons injected from the n-type layer. Reduced Mg concentration pulls the Fermi level of the p-type AlGaN barrier layer toward the middle of the band-gap, and consequently reduces the effective barrier height against injected electrons in the active layer. In addition, the p-type AlGaN barrier layer has another main function to fill the reverse coned shape recess therewith, but the reduction of Mg concentration in the p-type layer hinders such a function.

Furthermore, the invention is adaptable to a non-luminescence device such a rectifier diode device or the like. In this case, the remarkable effect is obtained similarly to the embodiment mentioned above.

In the embodiment mentioned above, there is adopted a method of forming the pits in-situ around threading dislocations in the active layer. In another embodiment, the etching may be employed after the formation of the active layer to penetrate the active layer along the threading dislocations. Namely, the wafer may be unloaded from the reactor after the formation of the active layer, and then etched to form pits in the active layer.

Besides, although the embodiment mentioned above involves the LED (light emitting diode) having a pn junction structure, the present invention is also adaptable to a semiconductor laser device having a multi-layer structure such as one of a single and multiple quantum well structure According to the invention, the barrier portion having a band-gap greater than that of the active layer and surrounding the threading dislocation to prevent carriers from diffusing to the threading dislocation, so that luminescence characteristics of the device is improved and the reverse leakage current is reduced.

It is understood that the foregoing description and accompanying drawings set forth the preferred embodiments of the invention at the present time. Various modifications, additions and alternative designs will, of course, become apparent to those skilled in the art in light of the foregoing teachings without departing from the spirit and scope of the disclosed invention. Thus, it should be appreciated that the invention is not limited to the disclosed embodiments but may be practiced within the full scope of the appended claims.

This application is based on a Japanese Patent Application No. 2001-177383 which is hereby incorporated by reference.

What is claimed is:

1. A nitride semiconductor device including Group III nitride semiconductors comprising:

an active layer;

a barrier layer made from a predetermined material and provided adjacent to said active layer, said barrier layer comprising a greater band-gap than a band gap of said active layer;

a barrier portion, formed of said predetermined material, for surrounding a threading dislocation in said active layer, said barrier portion comprising a vertex; and a semiconductor layer, comprising an impurity concentration ranging from $1\times10^{16}/cm^3$ to $1\times10^{17}/cm^3$, in which said vertex is placed.

2. A nitride semiconductor device according to claim 1, wherein said active layer comprises one of a single and multiple quantum well structure.

3. A nitride semiconductor device according to claim 1, wherein said predetermined material of said barrier layer fills up a recess enclosed with an interface on said active layer to smooth surfaces of said recess as the barrier portion.

4. A nitride semiconductor device according to claim 1, wherein said barrier portion comprises one of a cone-shape, truncated cone shape and a combination thereof.

5. A nitride semiconductor device according to claim 1, wherein said Group III nitride semiconductors comprise $(Al_xGa_{1-x})_{1-x} In_yN$ ($0 \leq x \leq 1$, $0 \leq y \leq 1$).

6. A nitride semiconductor device according to claim 5, further comprising:

a low temperature barrier layer provided between said barrier layer and said active layer, said low temperature barrier layer comprising substantially a same predetermined material as that of said barrier layer at substantially a same temperature as a growth temperature of said active layer.

7. A nitride semiconductor device according to claim 6, wherein said low temperature barrier layer comprises a composition ratio of AlN which is less than a composition ratio of said barrier layer.

* * * * *